(12) United States Patent
Yen et al.

(10) Patent No.: US 9,659,853 B2
(45) Date of Patent: May 23, 2017

(54) DOUBLE SIDE VIA LAST METHOD FOR DOUBLE EMBEDDED PATTERNED SUBSTRATE

(71) Applicant: Advanced Semiconductor Engineering, Inc., Kaohsiung (TW)

(72) Inventors: You-Lung Yen, Kaohsiung (TW); Chih-Cheng Lee, Kaohsiung (TW); Yuan-Chang Su, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 14/696,355

(22) Filed: Apr. 24, 2015

(65) Prior Publication Data

US 2016/0315041 A1    Oct. 27, 2016

(51) Int. Cl.
| | |
|---|---|
| *H01L 23/48* | (2006.01) |
| *H01L 23/498* | (2006.01) |
| *H01L 23/31* | (2006.01) |
| *H01L 21/48* | (2006.01) |
| *H01L 21/683* | (2006.01) |
| *H01L 23/544* | (2006.01) |

(52) U.S. Cl.
CPC ...... *H01L 23/49838* (2013.01); *H01L 21/486* (2013.01); *H01L 21/4857* (2013.01); *H01L 21/6835* (2013.01); *H01L 23/3121* (2013.01); *H01L 23/49822* (2013.01); *H01L 23/49827* (2013.01); *H01L 23/49833* (2013.01); *H01L 23/544* (2013.01); *H01L 2221/68345* (2013.01); *H01L 2223/54426* (2013.01); *H01L 2223/54486* (2013.01); *H01L 2224/73204* (2013.01)

(58) Field of Classification Search
CPC .......... H01L 23/49838; H01L 21/4857; H01L 21/486; H01L 21/6835; H01L 21/76805; H01L 21/76804; H01L 21/76813; H01L 21/76381; H01L 23/49822; H01L 23/49827; H01L 23/49833; H01L 2224/73204; H01L 2223/54486; H01L 2221/68345
See application file for complete search history.

(56) References Cited

U.S. PATENT DOCUMENTS

| | | |
|---|---|---|
| 7,745,933 B2 | 6/2010 | Yu |
| 7,921,550 B2 | 4/2011 | Yu |

(Continued)

*Primary Examiner* — Yosef Gebreyesus
(74) *Attorney, Agent, or Firm* — Foley & Lardner LLP; Cliff Z. Liu

(57) ABSTRACT

An interposer substrate includes a first circuit pattern embedded at a first surface of a dielectric layer and a second circuit pattern embedded at a second surface of the dielectric layer; a middle patterned conductive layer in the dielectric layer between the first circuit pattern and the second circuit pattern; first conductive vias, where each first conductive via includes a first end adjacent to the first circuit pattern and a second end adjacent to the middle patterned conductive layer, wherein a width of the first end is greater than a width of the second end; second conductive vias, where each second conductive via including a third end adjacent to the second circuit pattern and a fourth end adjacent to the middle patterned conductive layer, wherein a width of the third end is greater than a width of the fourth end.

11 Claims, 6 Drawing Sheets

(56) References Cited

U.S. PATENT DOCUMENTS

| | | | |
|---|---|---|---|
| 7,923,645 B1* | 4/2011 | Huemoeller | H05K 3/428 174/250 |
| 2003/0011070 A1* | 1/2003 | Iijima | H01L 21/4857 257/734 |
| 2004/0183187 A1* | 9/2004 | Yamasaki | H01L 21/76898 257/700 |
| 2006/0191715 A1* | 8/2006 | Koyama | H05K 3/20 174/264 |
| 2007/0256858 A1* | 11/2007 | Kariya | H01L 21/4857 174/260 |
| 2008/0079163 A1* | 4/2008 | Kurita | H01L 21/6835 257/759 |
| 2010/0096177 A1* | 4/2010 | Lee | H05K 1/113 174/264 |
| 2011/0155442 A1* | 6/2011 | Yamada | H01L 23/49822 174/266 |
| 2012/0032331 A1* | 2/2012 | Lee | H01L 23/49822 257/750 |
| 2012/0074585 A1* | 3/2012 | Koo | H01L 21/486 257/774 |
| 2013/0075927 A1* | 3/2013 | Chi | H01L 23/3135 257/774 |
| 2014/0070396 A1* | 3/2014 | Kyozuka | H01L 24/19 257/698 |
| 2014/0328038 A1* | 11/2014 | Kato | H01L 21/4857 361/761 |

* cited by examiner

DOUBLE SIDE VIA LAST METHOD FOR DOUBLE EMBEDDED PATTERNED SUBSTRATE

BACKGROUND

1. Technical Field

The present disclosure relates, in general, to an interposer substrate for semiconductor device packages and a method for making the same. More specifically, the present disclosure relates to a double embedded patterned interposer substrate and a double side via last manufacturing method for making the double embedded patterned substrate.

2. Description of the Related Art

There is continued demand for miniaturization, weight reduction, improved performance, improved reliability and lower costs in electronic products, such as for mobile phones and wearable electronics. Accordingly, improvements such as system-on-chip (SoC) packages have been developed. SoC packages integrate multiple functionalities at the chip level; however, designing and testing SoC packages can be difficult, and SoC manufacturing can be relatively high cost and low yield.

In addition to the demands on electronic products described above, demands on semiconductor devices in the electronic products include a demand for increased numbers of input/output signals. To accommodate large numbers of input/output signals, high density interconnect pitch can be implemented for adjoining semiconductor devices or substrates. However, the base substrate may also include a lower density interconnect pitch for connecting the input/output signals of a semiconductor device package to a system substrate (e.g. a printed circuit board (PCB) onto which the semiconductor device package substrate is mounted). It can be difficult to meet the requirements of both higher and lower density interconnect pitches in a base substrate.

SUMMARY

According to an embodiment of the present disclosure, an interposer substrate is provided. The interposer substrate includes a dielectric layer, a first circuit pattern, a second circuit pattern, a middle patterned conductive layer, at least one first conductive via and at least one second conductive via. The dielectric layer includes a first surface and a second surface opposite to the first surface. The first circuit pattern is embedded in the dielectric layer at the first surface of the dielectric layer. The second circuit pattern is embedded in the dielectric layer at the second surface of the dielectric layer. The middle patterned conductive layer is disposed within the dielectric layer and between the first circuit pattern and the second circuit pattern. The at least one first conductive via connects the first circuit pattern to the middle patterned conductive layer, and each of the at least one first conductive via includes a first end with a first width adjacent to the first circuit pattern and a second end with a second width adjacent to the middle patterned conductive layer, wherein the first width is greater than the second width. The at least one second conductive via connects the second circuit pattern to the middle patterned conductive layer, and each of the at least one second conductive via includes a third end with a third width adjacent to the second circuit pattern and a fourth end with a fourth width adjacent to the middle patterned conductive layer, wherein the third width is greater than the fourth width.

According to another embodiment of the present disclosure, a package structure is provided. The package structure includes a semiconductor device, an interposer substrate, a base substrate and an encapsulation layer. The interposer substrate includes a dielectric layer, a first circuit pattern, a second circuit pattern, a middle patterned conductive layer, at least one first conductive via and at least one second conductive via. The dielectric layer has a first surface and a second surface opposite to the first surface. The first circuit pattern is embedded in the dielectric layer at the first surface of the dielectric layer. The second circuit pattern is embedded in the dielectric layer at the second surface of the dielectric layer. The middle patterned conductive layer is disposed within the dielectric layer and between the first circuit pattern and the second circuit pattern. The at least one first conductive via connects the first circuit pattern to the middle patterned conductive layer, and each first conductive via includes a first end adjacent to the first circuit pattern and a second end adjacent to the middle patterned conductive layer. The at least one second conductive via connects the second circuit pattern to the middle patterned conductive layer, and each second conductive via includes a third end adjacent to the second circuit pattern and a fourth end adjacent to the middle patterned conductive layer. For each of the at least one first conductive via, a width at the first end is greater than a width at the second end; and for each of the at least one second conductive via, a width at the third end is greater than a width at the fourth end. The interposer substrate is disposed between the semiconductor device and the base substrate and electrically connects the semiconductor device to the base substrate. The encapsulation layer is over the base substrate and encapsulates the semiconductor device and the interposer substrate.

According to another embodiment of the present disclosure, a process of fabricating an interposer substrate is provided. A sub-substrate including a first circuit pattern, a first dielectric layer and a middle patterned conductive layer is provided. The first dielectric layer covers the first circuit pattern, and the middle patterned conductive layer is on the first dielectric layer. A second dielectric layer is integrated between the sub-structure and a second circuit pattern, where the middle patterned conductive layer is disposed between the first dielectric layer and the second dielectric layer. At least one first conductive via is formed to connect the first circuit pattern to the middle patterned conductive layer. At least one second conductive via is formed to connect the second circuit pattern to the middle patterned conductive layer.

BRIEF DESCRIPTION OF THE DRAWINGS

Common reference numerals are used throughout the drawings and the detailed description to indicate same or similar elements. The present disclosure will be more apparent if the following detailed description is taken in conjunction with the accompanying drawings.

DETAILED DESCRIPTION

Figure 1:
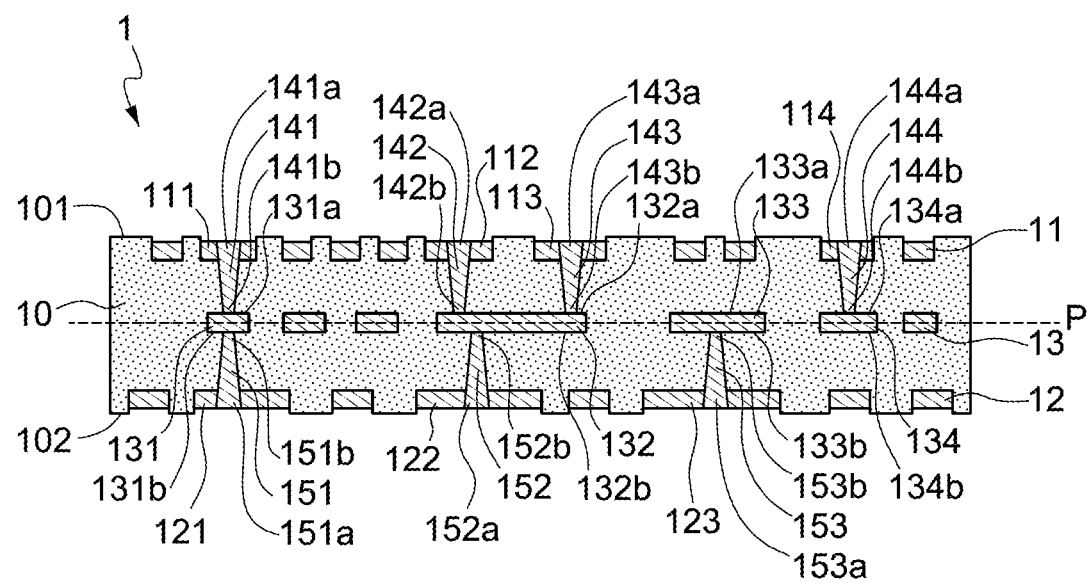
FIG. 1 illustrates a cross-sectional view of an interposer substrate in accordance with an embodiment of the present disclosure.

An interposer substrate or substrates can be disposed between semiconductor device(s) and a base substrate in a semiconductor device package, where the interposer substrate can have an interconnect pitch between that of the higher density interconnect pitch of the semiconductor device and the lower density interconnect pitch of the base substrate, providing a transition between the higher density interconnect pitch and the lower density interconnect pitch.

Described in this disclosure is an interposer substrate.

The following definitions apply to some of the aspects described with respect to some embodiments of the disclosure. These definitions may likewise be expanded upon herein.

As used herein, the singular terms "a," "an," and "the" include plural referents unless the relevant context clearly dictates otherwise. Thus, for example, reference to a middle patterned layer can include multiple middle patterned layers unless the relevant context clearly dictates otherwise.

As used herein, the term "adjacent" refers to being near or adjoining. Adjacent components can be spaced apart from one another or can be in actual contact with one another. In some instances, adjacent components can be connected to one another or can be formed integrally with one another.

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another; this orientation of the components is in accordance with the drawings, but is not required during manufacturing or use.

As used herein, the terms "connect," "connected," and "connection" refer to an operational coupling or linking. Connected components can be directly or indirectly coupled to one another, for example, through another set of components.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, electrical conductivity of a material is defined at room temperature.

As used herein, the terms "approximately," "substantially" "substantial," and "about" refer to a considerable degree or extent. When used in conjunction with an event or situation, the terms can refer to instances in which the event or situation occurs precisely as well as instances in which the event or situation occurs to a close approximation, such as when accounting for typical tolerance levels of the manufacturing methods described herein. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

A surface can be deemed to be planar or substantially planar if a difference between a highest point and a lowest point on the surface is small, such as no greater than 1 µm, no greater than 5 µm, no greater than 10 µm, or no greater than 50 µm. Two surfaces can be deemed to be coplanar or substantially coplanar if a displacement between the two surfaces is small, such as no greater than 1 µm, no greater than 5 µm, no greater than 10 µm, or no greater than 50 µm.

Additionally, amounts, ratios, and other numerical values are sometimes presented herein in a range format. It is understood that such range formats are used for convenience and brevity, and should be interpreted flexibly to include numerical values explicitly specified as limits of a range, as well as all individual numerical values or sub-ranges encompassed within that range, as if each numerical value and sub-range is explicitly specified.

To increase circuit density of an interposer substrate, a middle patterned conductive layer can be buried in the interposer substrate for routing between the circuit pattern on the top surface of the interposer substrate and the circuit pattern on the bottom surface of the interposer substrate. The middle patterned conductive layer can be integrated between two dielectric layers. Manufacturing a fine pitch interposer substrate can be expensive and can involve manufacturing processes with a high degree of complexity. For example, first vias and a middle patterned conductive layer can be formed in an interposer substrate, and subsequently, via holes can be laser drilled to align with the first vias and metal plated to form second vias. Using this technique, a dimple phenomenon can occur when forming a first via, which can create a risk of cracking a corner of the first via when a second via is formed to align with the first via.

One technique for minimizing the risk of cracking a corner of a first via is to form a thicker middle patterned conductive layer, resulting in a thicker interposer substrate. Another technique for minimizing the risk of cracking a corner of a first via is to introduce an offset between the first via and the second via so that the second via will not be stacked on the first via.

FIG. 1 illustrates an interposer substrate in accordance with an embodiment of the present disclosure, with a double-sided via in a double-embedded patterned substrate. An interposer substrate 1 includes a dielectric layer 10, a first circuit pattern 11, a second circuit pattern 12, a middle patterned conductive layer 13, first conductive vias 141, 142, 143, 144, and second conductive vias 151, 152, 153. The dielectric layer 10 has a first surface 101 and a second surface 102 opposite to the first surface 101. The dielectric layer 10 can be formed from a dielectric material, such as, but not limited to, polyimide, polybenzoxazole, benzocyclobutene or a combination thereof.

The first circuit pattern 11 is embedded in the dielectric layer 10 at the first surface 101 of the dielectric layer 10. The second circuit pattern 12 is embedded in the dielectric layer 10 at the second surface 102 of the dielectric layer 10. The middle patterned conductive layer 13 is disposed within the dielectric layer 10 and between the first circuit pattern 11 and the second circuit pattern 12. The first circuit pattern 11, the second circuit pattern 12 and the middle patterned conductive layer 13 may be formed of the same material(s) as each other, or one or more of the first circuit pattern 11, the second circuit pattern 12 and the middle patterned conductive layer 13 may be formed of different materials. The first circuit pattern 11, the second circuit pattern 12 and the middle patterned conductive layer 13 can be formed from a metal, a metal alloy, a matrix with a metal or a metal alloy dispersed therein or another suitable electrically conductive material. The first circuit pattern 11 and the second circuit pattern 12 can include traces, pads or other metal patterns for electrical connection. The middle patterned conductive layer 13 can include one or more via pads. In some embodiments of the present disclosure, the middle patterned conductive layer 13 further includes traces or other metal patterns, thereby increasing the flexibility of the layout.

The first conductive vias 141, 142, 143, 144 connect the first circuit pattern 11 to the middle patterned conductive layer 13. The second conductive vias 151, 152, 153 connect the second circuit pattern 12 to the middle patterned conductive layer 13. The first conductive vias 141, 142, 143, 144 include respective first ends 141a, 142a, 143a, 144a adjacent to the first circuit pattern 11, and respective second ends 141b, 142b, 143b, 144b adjacent to the middle patterned conductive layer 13. For each of the first conductive vias 141, 142, 143, 144, a width of the respective first ends 141a, 142a, 143a, 144a is greater than a width of the respective second ends 141b, 142b, 143b, 144b. In other words, for the embodiment shown in FIG. 1, the widths of the first conductive vias 141, 142, 143, 144 gradually decrease from the respective first ends 141a, 142a, 143a, 144a to the respective second ends 141b, 142b, 143b, 144b. The second conductive vias 151, 152, 153 include respective third ends 151a, 152a, 153a adjacent to the second circuit pattern 12, and respective fourth ends 151b, 152b, 153b adjacent to the middle patterned conductive layer 13. For each of the second conductive vias 151, 152, 153, a width of the respective third ends 151a, 152a, 153a is greater than a width of the respective fourth ends 151b, 152b, 153b. In other words, for the embodiment shown in FIG. 1, the widths of the second conductive vias 151, 152, 153 gradually decrease from the respective third ends 151a, 152a, 153a to the respective fourth ends 151b, 152b, 153b.

As shown in FIG. 1, the first conductive via 141 and the second conductive via 151 are substantially plane-symmetric with respect to a plane defined by the middle patterned conductive layer 13, such as plane P shown in dotted line through the middle patterned conductive layer 13. Such a symmetrical structure can reduce a mismatch in the coefficient of thermal expansion (CTE) between different components of the substrate; warpage is thereby reduced, and variation due to changes in temperature is reduced.

As shown in FIG. 1, the interposer substrate 1 further includes first via pads 111, 112, 113, 114 in the first circuit pattern 11, second via pads 121, 122, 123 in the second circuit pattern 12, and middle via pads 131, 132, 133, 134 in the middle patterned circuit layer 13. The first conductive via 141 is connected to the first circuit pattern 11 at the first via pad 111, and is connected to the middle patterned conductive layer 13 at the middle via pad 131. The second conductive via 151 is connected to the second circuit pattern 12 at the second via pad 121, and is connected to the middle patterned conductive layer 13 at the middle via pad 131. A width of the middle via pad 131 can be less than or equal to a width of the first via pad 111, and further may be less than or equal to a width of the second via pad 121; thereby, the circuit routing in the middle patterned conductive layer 13 can be more flexible and the circuit density of the interposer substrate 1 can be increased. A top surface 131a and a bottom surface 131b of the middle via pad 131 are each substantially planar to improve connection to the first conductive via 141 and the second conductive via 151, respectively. That is, if the middle via pad 131 has an uneven top surface 131a or an uneven bottom surface 131b, the formation of the first conductive via 141 or the second conductive via 151, respectively, can be affected. Thus, planarity improves the connections.

Both of the first conductive vias 142, 143 are connected to the middle patterned conductive layer 13 at the middle via pad 132. The first conductive via 142 is connected to the first circuit pattern 11 at the first via pad 112, and the first conductive via 143 is connected to the first circuit pattern 11 at the first via pad 113. The second conductive via 152 is connected to the second circuit pattern 12 at the second via pad 122, and is connected to the middle patterned conductive layer 13 at the middle via pad 132. A top surface 132a and a bottom surface 132b of the middle via pad 132 are each substantially planar to improve connection to the first conductive vias 142, 143 and the second conductive via 152, respectively.

The first conductive via 144 is connected to the first circuit pattern 11 at the first via pad 114, and is connected to the middle patterned conductive layer 13 at the middle via pad 134. The second conductive via 153 is connected to the second circuit pattern 12 at the second via pad 123, and is connected to the middle patterned conductive layer 13 at the middle via pad 133. A width of the middle via pad 133 may be less than or equal to a width of the second via pad 123, and a width of the middle via pad 134 may be less than or equal to a width of the first via pad 114. A top surface 133a of the middle via pad 133 is substantially planar, a bottom surface 133b of the middle via pad 133 is substantially planar to improve connection to the second conductive via 153, a top surface 134a of the middle via pad 134 is substantially planar to improve connection to the first conductive via 144, and a bottom surface 134b of the middle via pad 134 is substantially planar.

It is also shown in FIG. 1 that the first circuit pattern 11 and the second circuit pattern 12 are respectively recessed from the first surface 101 and the second surface 102. The recessing minimizes the occurrence of soldering problems, such as solder bridges (shorts), by confining the solder in the recesses, such as when using solder on pads of the first circuit pattern 11 or the second circuit pattern 12 to connect the interposer substrate 1 with another component in a package structure (e.g. a semiconductor device or a base substrate).

Figure 2:
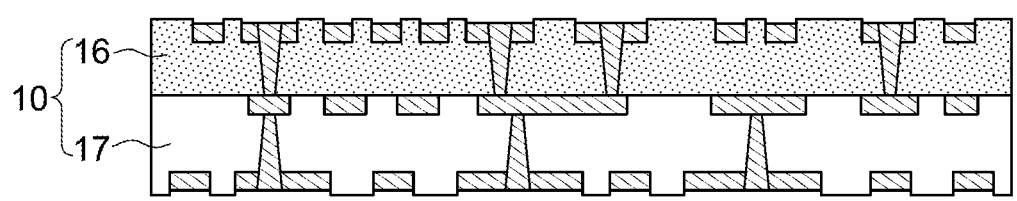
FIG. 2 illustrates a cross-sectional view of an interposer substrate in accordance with another embodiment of the present disclosure.

FIG. 2 illustrates a cross-sectional view of an interposer substrate 2 in accordance with another embodiment of the present disclosure. The interposer substrate 2 is similar to the interposer substrate 1 shown in FIG. 1, except that the dielectric layer 10 of the interposer substrate 2 comprises at least two dielectric sub-layers, such as dielectric layers 16 and 17. In an embodiment of the present disclosure, the dielectric layers 16 and 17 can be formed of the same material. For example, the dielectric layers 16 and 17 can both be formed of, or may include, pre-impregnated composite fibers (pre-preg), polyimide, polybenzoxazole, benzocyclobutene, or a combination thereof. In an embodiment of the present disclosure, the two dielectric layers 16 and 17 can be formed of different materials. The material of the dielectric layer 16 can be selected from materials whose modulus of rigidity and glass transition temperatures are each greater than the modulus of rigidity and glass transition temperatures of the material of the dielectric layer 17, for example, so as to resist deformation of the interposer substrate 2 when the interposer substrate 2 is heated, and to limit the warpage of the interposer substrate 2.

FIG. 3A, FIG. 3B, FIG. 3C, FIG. 3D, FIG. 3E, FIG. 3F, FIG. 3G and FIG. 3H illustrate a process of fabricating an interposer substrate in accordance with an embodiment of the present disclosure.

Figure 3A:
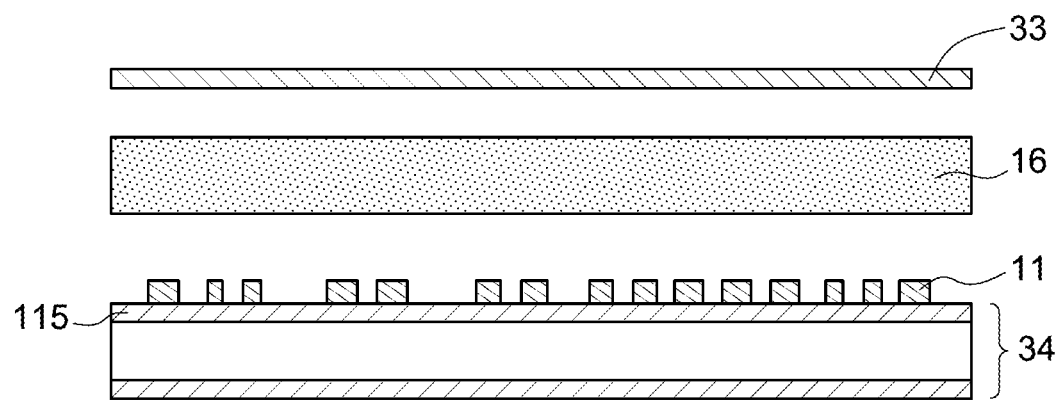
FIG. 3A, FIG. 3B, FIG. 3C, FIG. 3D, FIG. 3E, FIG. 3F, FIG. 3G and FIG. 3H illustrate a fabricating process in accordance with an embodiment of the present disclosure.
Figure 3B:
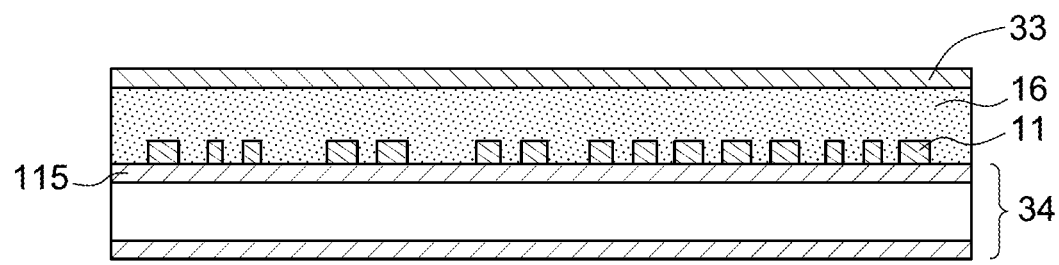
Figure 3C:
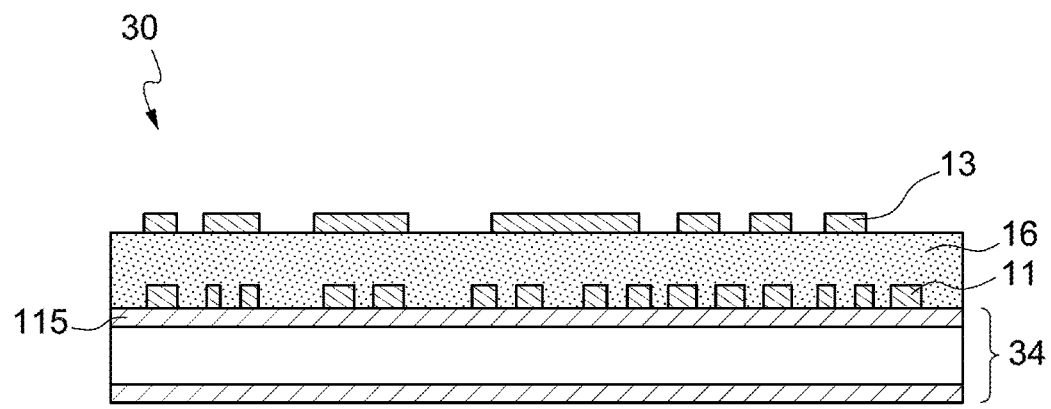

Referring to FIG. 3A, a first circuit pattern 11 is formed on a first carrier 34. A first dielectric layer 16 and a conductive layer 33 are provided. Specifically, the first circuit pattern 11 is formed on a metal foil 115 covering a surface of the first carrier 34. Referring to FIG. 3B, the first dielectric layer 16 is integrated between the first circuit pattern 11 and the conductive layer 33. Referring to FIG. 3C, a middle patterned conductive layer 13 is formed by patterning the conductive layer 33. Each of a top surface and a bottom surface of the middle patterned conductive layer 13 are substantially planar, because the middle patterned conductive layer 13 is formed from a laminate conductive layer. The first carrier 34, the first circuit pattern 11, the first dielectric layer 16 and the middle patterned conductive layer 13 form a sub-structure 30.

Figure 3D:
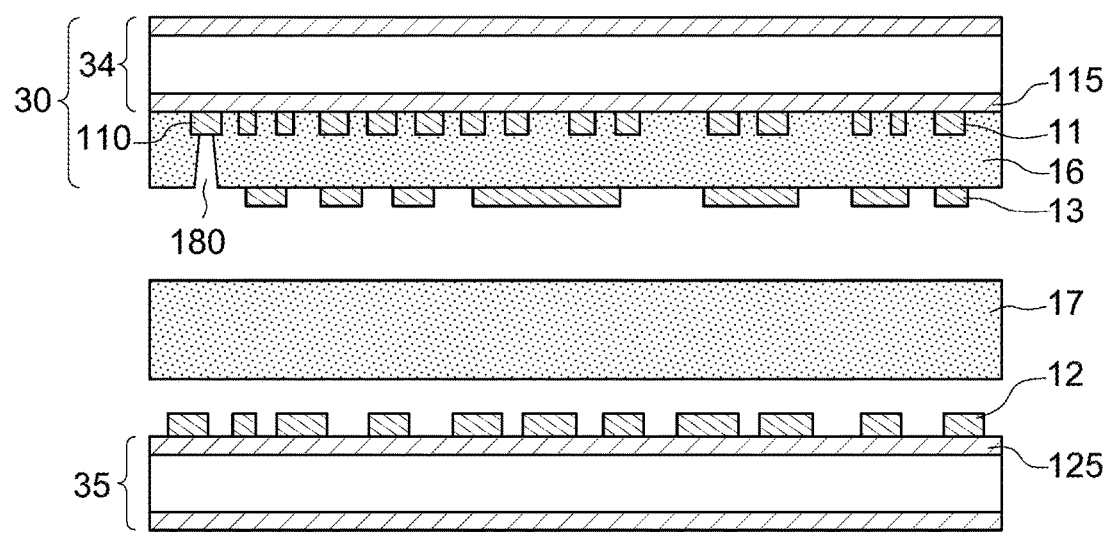

Referring to FIG. 3D, an opening 180 is formed in the first dielectric layer 16 to expose an alignment mark 110. The alignment mark 110 is used to align the substructure 30 with a circuit pattern formed on a second carrier. Specifically, a second circuit pattern 12 is formed on a metal foil 125 covering a surface of a second carrier 35. A second dielectric layer 17 is integrated between the sub-structure 30 and the second circuit pattern 12. A middle patterned conductive layer 13 is disposed between the first dielectric layer 16 and the second dielectric layer 17.

Figure 3E:
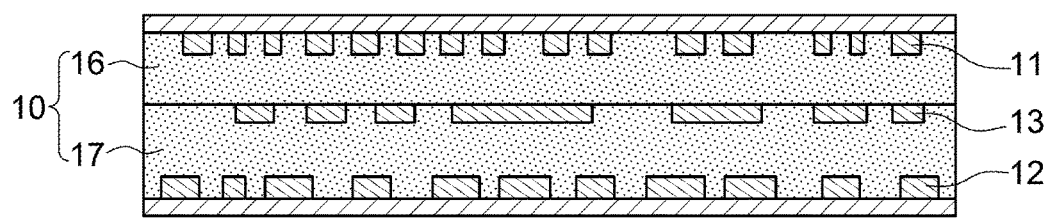

Referring to FIG. 3E, the second dielectric layer 17 (and also the first dielectric layer 16 in some embodiments) includes a material (e.g., a resin) with a property of melting at a particular temperature. At about that particular temperature, the sub-structure 30 and the second carrier 35 with the second circuit pattern 12 are pressed together with the dielectric layer 17 between, such as by applying pressure to one or both of the first dielectric layer 16 and the second dielectric layer 17. As pressure is being applied, the material in the second dielectric layer 17 fills the opening 180.

Then, still referring to FIG. 3E, the first carrier 34 and the second carrier 35 are removed. The metal foils 115 and 125 respectively remain in contact with the first circuit pattern 11 and the second circuit pattern 12.

Figure 3F:
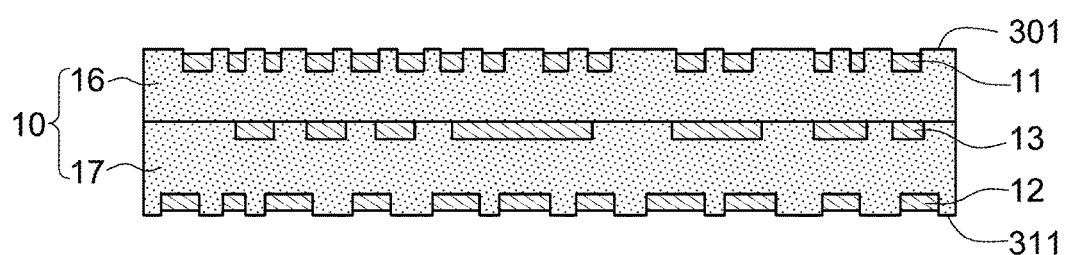

Referring to FIG. 3F, the metal foils 115 and 125 are removed by etching. The first dielectric layer 16 includes a first surface 301, and the second dielectric layer 17 includes a second surface 311. After etching, the first circuit pattern 11 and the second circuit pattern 12 are recessed from the first surface 301 and the second surface 311, respectively.

Figure 3G:
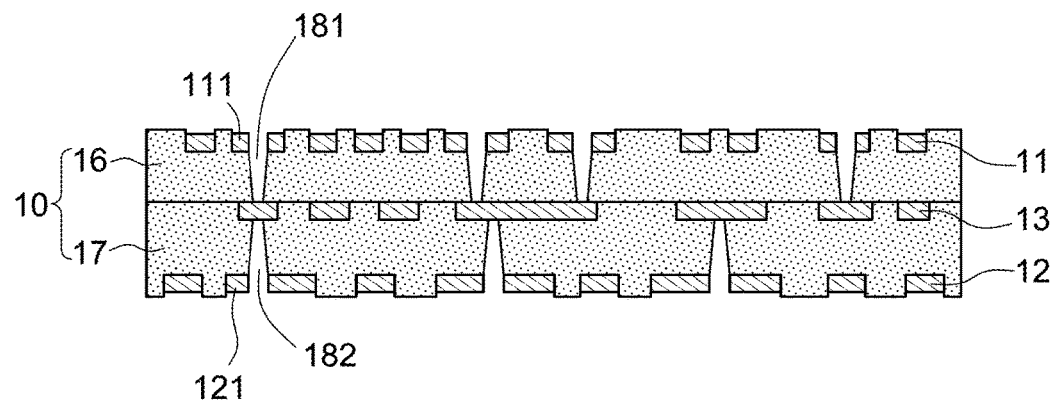

Referring to FIG. 3G, the first circuit pattern 11 includes at least one first ring-shaped via pad 111, and the second circuit pattern 12 includes at least one second ring-shaped via pad 121. At least one first via hole 181 is formed by providing energy through the at least one first ring-shaped via pad 111, and at least one second via hole 182 is formed by providing energy through the at least one second ring-shaped via pad 121. For example, energy may be provided by a laser. Using a ring-shaped via pad as a mask when forming via holes allows for control of the size of the via holes by confining the energy passing through the ring-shaped via pad.

Figure 3H:
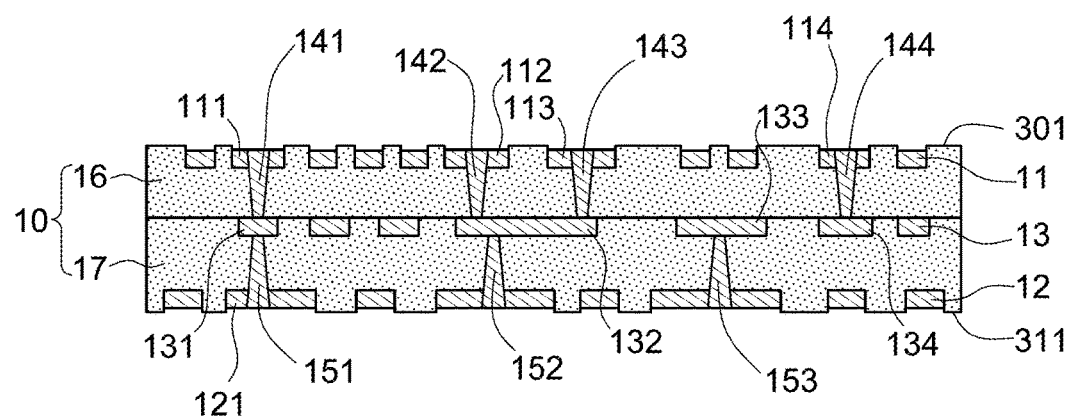

Referring to FIG. 3H, by filling the at least one first via hole 181 and the at least one second via hole 182 with conductive material, first conductive vias 141, 142, 143, 144 are formed to connect the first circuit pattern 11 to the middle patterned conductive layer 13, and second conductive vias 151, 152, 153 are formed to connect the second circuit pattern 12 to the middle patterned conductive layer 13. The interposer substrate 1 of FIG. 1 or the interposer substrate 2 of FIG. 2 is thereby formed (i.e., interposer substrate 1 when the first dielectric layer 16 and the second dielectric layer 17 are made of the same material or are one layer, and interposer substrate 2 when the first dielectric layer 16 and the second dielectric layer 17 are made of different materials or formed as separate layers).

Since the first conductive vias 141, 142, 143, 144 and the second conductive vias 151, 152, 153 are formed concurrently, with positioning defined by the ring-shaped via pads (conformal rings), via alignment errors may be reduced.

Figure 4:
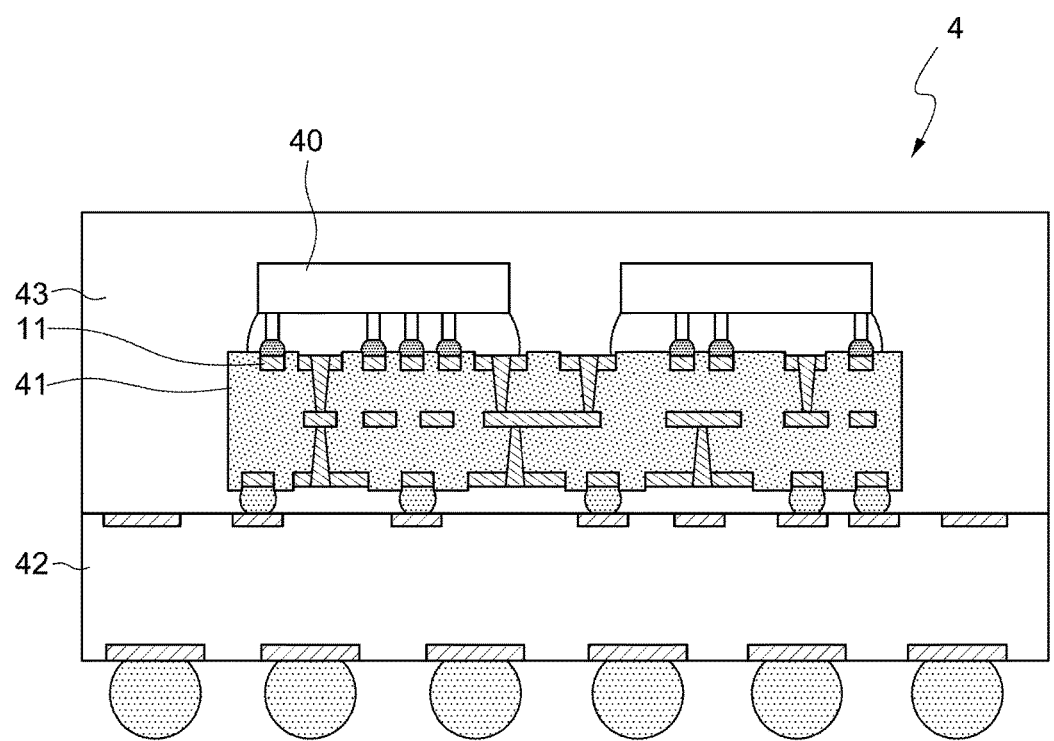
FIG. 4 illustrates a package structure with an interposer substrate according to an embodiment of the present disclosure.

FIG. 4 illustrates a package structure with an interposer substrate according to embodiments of the present disclosure. A package structure 4 includes at least one semiconductor device 40, an interposer substrate 41 according to the present disclosure, a base substrate 42 and an encapsulation layer 43. The interposer substrate 41 is disposed between the semiconductor device(s) 40 and the base substrate 42, and electrically connects the semiconductor device(s) 40 to the base substrate 42. The encapsulation layer 43 is formed over the base substrate 42 and encapsulates the semiconductor device(s) 40 and the interposer substrate 41. A line width of the first circuit pattern 11 on the interposer substrate 41 that is electrically connected to the semiconductor device 40 is in a range from about 2 μm to about 10 μm.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims.

The construction and arrangement of the packages and methods as shown in the various exemplary embodiments are illustrative only. Accordingly, all such modifications are intended to be included within the scope of the present disclosure. The order or sequence of any of the processed or method steps may be varied or re-sequenced according to alternative embodiments. Other substitutions, modifications, changes, and omissions may be made in the design, operating conditions and arrangements of the example embodiments without departing from the scope of the present disclosure.

What is claimed is:

1. An interposer substrate, comprising:
   a dielectric layer with a first surface and a second surface opposite to the first surface, wherein the dielectric layer is formed of a same material throughout the dielectric layer;
   a first circuit pattern embedded in the dielectric layer and disposed at the first surface of the dielectric layer;
   a second circuit pattern embedded in the dielectric layer and disposed at the second surface of the dielectric layer;
   a middle patterned conductive layer disposed within the dielectric layer and between the first circuit pattern and the second circuit pattern, wherein the middle patterned conductive layer is single layered;
   at least one first conductive via connecting the first circuit pattern to the middle patterned conductive layer, each of the at least one first conductive via including a first end with a first width adjacent to the first circuit pattern and a second end with a second width adjacent to the middle patterned conductive layer, wherein the first width is greater than the second width; and at least one second conductive via connecting the second circuit pattern to the middle patterned conductive layer, each of the at least one second conductive via including a third end with a third width adjacent to the second circuit pattern and a fourth end with a fourth width adjacent to the middle patterned conductive layer, wherein the third width is greater than the fourth width.

2. The interposer substrate according to claim 1, wherein each of the at least one first conductive via decreases in size from the first width at the first end to the second width at the second end, and each of the at least one second conductive via decreases in size from the third width at the third end to the fourth width at the fourth end.

3. The interposer substrate according to claim 1, wherein the dielectric layer comprises at least two dielectric sub-layers.

4. The interposer substrate according to claim 1, wherein the middle patterned conductive layer comprises a middle circuit pattern.

5. The interposer substrate according to claim 1, wherein the at least one first conductive via and the at least one second conductive via are substantially plane-symmetric with respect to a plane defined by the middle patterned conductive layer.

6. The interposer substrate according to claim 1, the first circuit pattern comprising at least one first via pad, the second circuit pattern comprising at least one second via pad, and the middle patterned conductive layer comprising at least one middle via pad, wherein one of the at least one first conductive via is connected to the first circuit pattern at a respective first via pad and is connected to the middle patterned conductive layer at a respective middle via pad, and one of the at least one second conductive via is connected to the second circuit pattern at a respective second via pad and is connected to the middle patterned conductive layer at the respective middle via pad, and wherein a width of the respective middle via pad is less than or equal to a width of the respective first via pad or a width of the respective second via pad.

7. The interposer substrate according to claim 6, wherein the respective middle via pad includes a top surface and a bottom surface, and both the top surface and the bottom surface of the respective middle via pad are substantially planar.

8. The interposer substrate according to claim 1, the first circuit pattern comprising at least one first via pad, the second circuit pattern comprising at least one second via pad, and the middle patterned conductive layer comprising at least one middle via pad, wherein one of the at least one first conductive via is connected to the first circuit pattern at a respective first via pad having a fifth width and is connected to the middle patterned conductive layer at a respective middle via pad having a sixth width, and one of the at least one second conductive via is connected to the second circuit pattern at a respective second via pad having a seventh width and is connected to the middle patterned conductive layer at another respective middle via pad having an eighth width, and wherein the sixth width is less than or equal to the fifth width, and the eighth width is less than or equal to the seventh width.

9. The interposer substrate according to claim 8, wherein each of the respective middle via pads has a substantially planar top surface and a substantially planar bottom surface.

10. A package structure, comprising:
a semiconductor device;
an interposer substrate, comprising:
a dielectric layer with a first surface and a second surface opposite to the first surface;
a first circuit pattern embedded in the dielectric layer and disposed at the first surface of the dielectric layer;
a second circuit pattern embedded in the dielectric layer and disposed at the second surface of the dielectric layer;
a middle patterned conductive layer disposed within the dielectric layer and between the first circuit pattern and the second circuit pattern, wherein the middle patterned conductive layer is single layered;
at least one first conductive via connecting the first circuit pattern to the middle patterned conductive layer, each of the at least one first conductive via including a first end adjacent to the first circuit pattern and a second end adjacent to the middle patterned conductive layer; and
at least one second conductive via connecting the second circuit pattern to the middle patterned conductive layer, each of the at least one second conductive via including a third end adjacent to the second circuit pattern and a fourth end adjacent to the middle patterned conductive layer;
wherein, for each of the at least one first conductive via, a width at the first end is greater than a width at the second end; and for each of the at least one second conductive via, a width at the third end is greater than a width at the fourth end;
a base substrate, wherein the interposer substrate is disposed between the semiconductor device and the base substrate and electrically connects the semiconductor device to the base substrate; and
an encapsulation layer over the base substrate, wherein the encapsulation layer encapsulates the semiconductor device and the interposer substrate.

11. The package structure according to claim 10, wherein the first circuit pattern is electrically connected to the semiconductor device, and a line width of the first circuit pattern is in a range from 2 μm to 10 μm.

* * * * *